United States Patent [19]

Schotz et al.

[11] 4,122,395
[45] Oct. 24, 1978

[54] RADIO CONTROL CIRCUIT WITH MICROPROCESSOR

[75] Inventors: Larry A. Schotz, Glendale; Thomas W. Wiesmann, Milwaukee, both of Wis.

[73] Assignee: Draco Laboratories, Inc., Milwaukee, Wis.

[21] Appl. No.: 780,391

[22] Filed: Mar. 23, 1977

Related U.S. Application Data

[63] Continuation-in-part of Ser. No. 684,523, May 10, 1976, abandoned.

[51] Int. Cl.² .............................................. H04B 1/26
[52] U.S. Cl. .................................. 325/453; 325/455; 325/464; 325/468; 340/324 R
[58] Field of Search ............... 325/453, 455, 459, 464, 325/468; 340/324 R

[56] References Cited

U.S. PATENT DOCUMENTS

| | | | |
|---|---|---|---|
| 3,795,863 | 3/1974 | Umeda et al. | 340/324 R |
| 3,796,951 | 3/1974 | Joseph | 340/324 R |
| 3,835,384 | 9/1974 | Liff | 325/419 |
| 3,962,644 | 6/1976 | Baker | 325/459 |
| 3,983,492 | 9/1976 | Fisher et al. | 325/468 |
| 3,986,154 | 10/1976 | Yamada et al. | 325/469 |
| 4,015,253 | 3/1977 | Goldstein | 325/455 |

Primary Examiner—Robert L. Griffin
Assistant Examiner—Marc E. Bookbinder
Attorney, Agent, or Firm—Wheeler, Morsell, House & Fuller

[57] ABSTRACT

An FM tuner control circuit contains a digital frequency synthesizing control circuit, digital computer means including a microprocessor, a memory circuit, and a manual control circuit for digitally tuning the tuner to any desired FM station. The memory circuit includes a read-only memory containing programs for the microprocessor and a random-access memory in which a group of predetermined station frequencies can be stored. The control circuit also includes a call letter display circuit, a frequency scale pointer display circuit, a frequency display circuit, a manual tuning circuit, and remote control switches for the manual control circuit.

19 Claims, 10 Drawing Figures

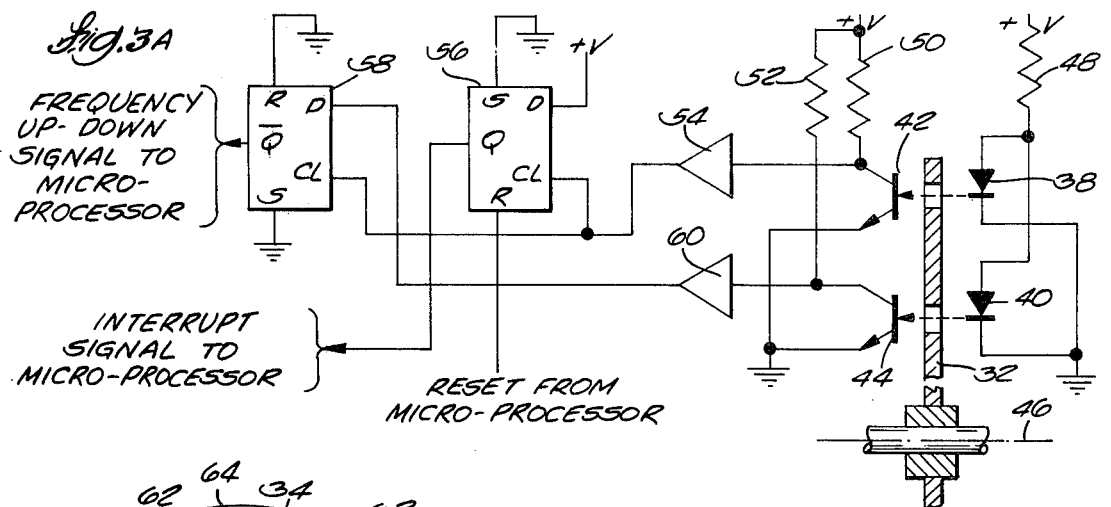
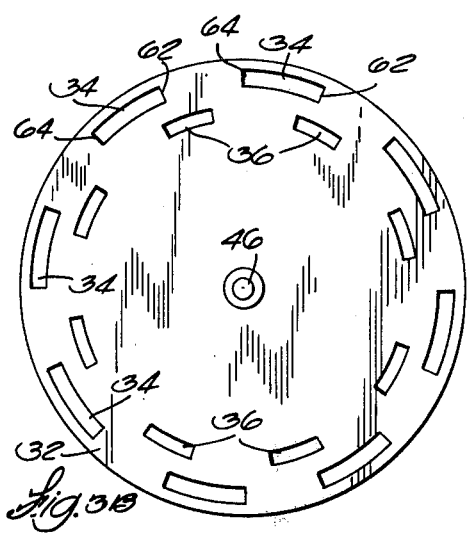
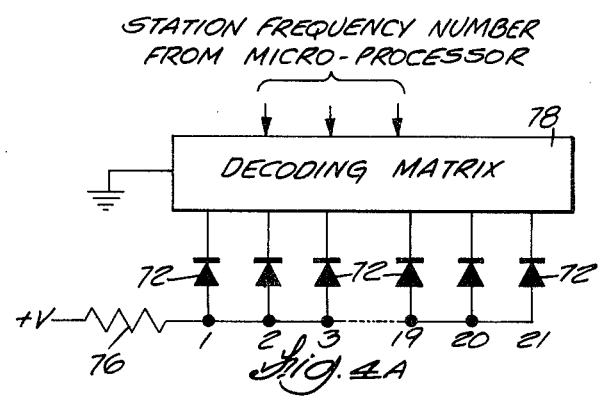
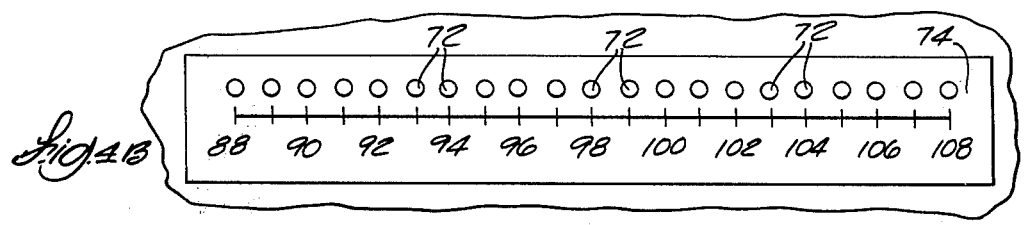
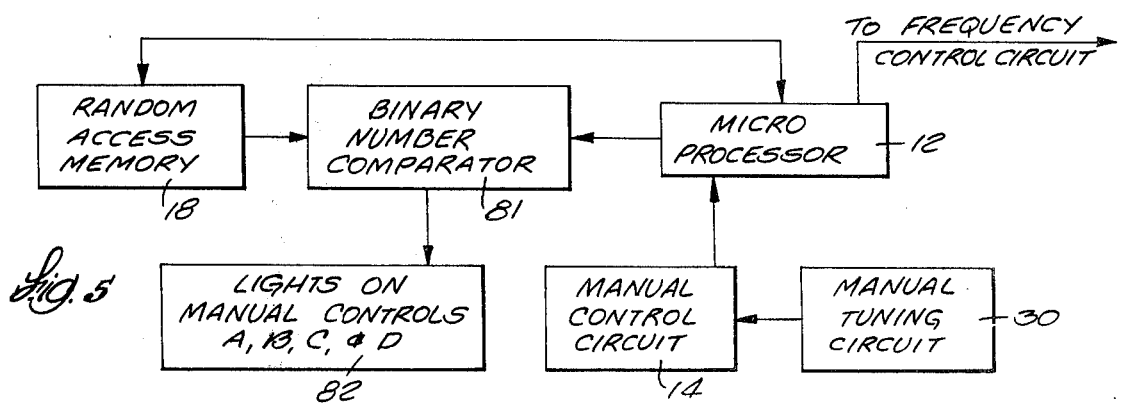

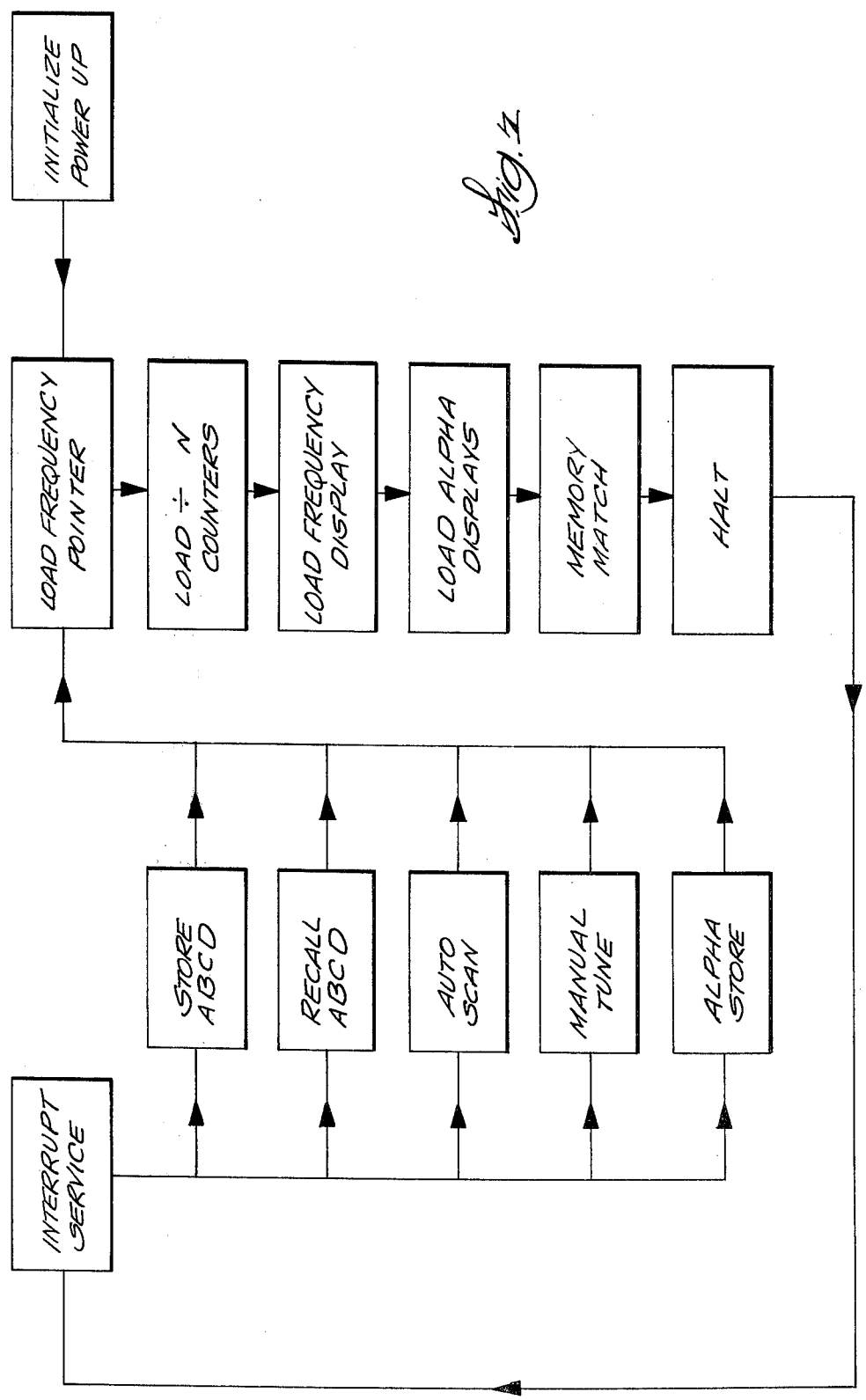

RADIO CONTROL CIRCUIT WITH MICROPROCESSOR

CROSS-REFERENCED APPLICATION

This is a continuation-in-part of application Ser. No. 684,523, filed May 10, 1976, now abandoned.

BACKGROUND OF INVENTION

This invention relates to radio control circuits and more particularly to digital radio control circuits. Digital frequency control circuits are known in the prior art in which the frequency of an FM tuner is controlled by a phase locked loop which compares the frequency of a reference oscillator to the output of a divide-by-N counter that is driven by the tuner's local oscillator. The local oscillator is a voltage controlled oscillator whose frequency is controlled by the output voltage of a frequency comparator; which is proportional to the difference of frequency between the reference oscillator and the divide-by-N counter. The frequency of the local oscillator is digitally tuned by changing the divisor number N in the divide-by-N counter, which causes the frequency comparator to tune the local oscillator to a new frequency which produces an output frequency of the divide-by-N counter that equals the frequency of the reference oscillator.

SUMMARY OF INVENTION

This invention is an improvement in the above-described type of radio control circuit and provides several novel digital frequency control functions through the use of a general purpose microprocessor which is coupled to the digital frequency control circuit, to one or more memory units, and to a manual control circuit. The novel digital frequency control functions include the ability to store several frequently used station frequencies in the memory, to tune to any one of these frequencies by simply touching a switch and to display the numerical value of the frequency. Means are provided for storing the call letters of a large number of stations and for causing the appropriate call letters to be displayed when a station having the corresponding frequency is tuned. The novel functions also include the ability to scan the local oscillator frequency either upwardly and downwardly in frequency until the next station is detected and to reverse the direction of scanning at the end of the receiver band if a new station is not detected and start scanning in the opposite direction from the frequency at which the scanning operation was initiated. The scanning operation preferably terminates automatically after the other limit of the receiver band is reached without detecting a new station. The radio control circuit discussed herein has a novel call letter display circuit, a novel frequency pointer display circuit, a station frequency display circuit, and a novel manual tuning circuit. A novel simplified circuit is provided for displaying characters, such as the station call letters, involving controlling a character generator in such manner that the number of electronic components can be reduced as compared with conventional circuits.

DESCRIPTION OF DRAWINGS

FIG. 3A is a schematic circuit diagram of the preferred circuit for the manual tuning circuit shown in FIG. 1.

FIG. 3B is a plan view of the tuning disc shown in FIG. 3A.

FIG. 4A is a schematic circuit diagram of the preferred circuit for the analog pointer display circuit shown in FIG. 1.

FIG. 4B is a front view of the preferred display for the analog pointer display circuit shown in FIGS. 1 and 4A.

FIG. 5 is a detail block diagram of a memory match circuit which turns on the indicator lights for the stored frequencies any time the tuner is tuned to one of the stored frequencies.

FIG. 7 is a logic flow chart for the system.

DESCRIPTION OF PREFERRED EMBODIMENT

Although the ensuing description of the invention is specific to enable those skilled in the art to practice the invention, the physical embodiments herein disclosed merely exemplify the invention which may be embodied in other structure. The scope of the invention is defined in the claims appended hereto.

Figure 1:
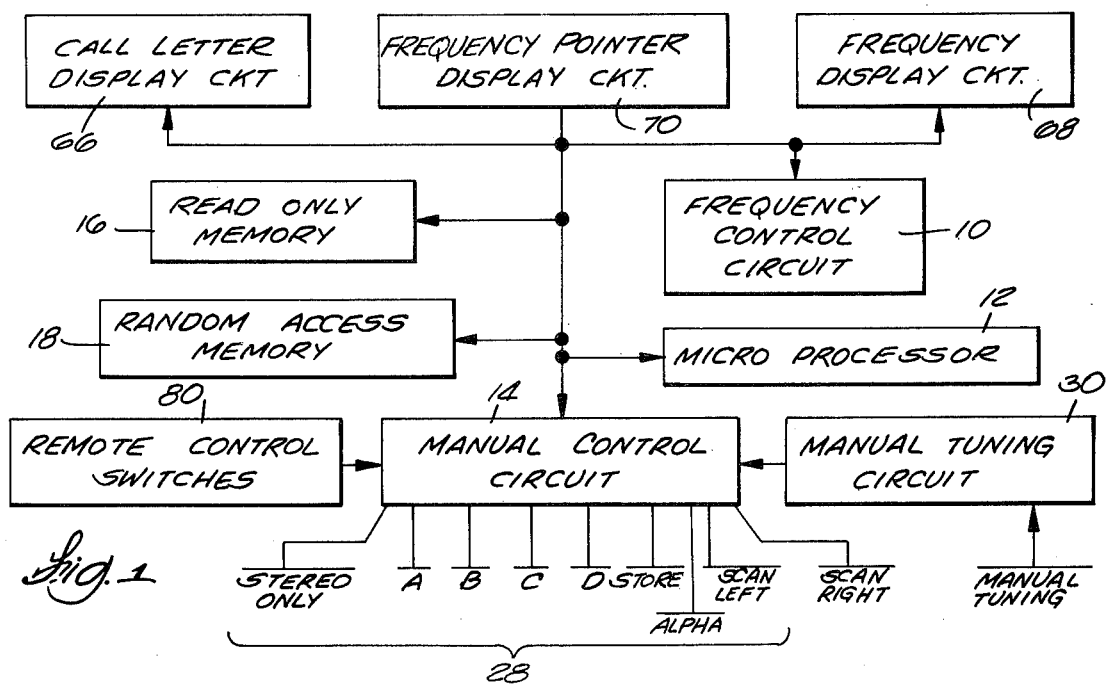
FIG. 1 is a block diagram of the preferred embodiment of the invention.

Referring to FIG. 1, the preferred embodiment includes a digital frequency control circuit 10 which is controlled by a microprocessor 12, manual control circuit 14, read-only memory 16, and random-access memory 18. Frequency control circuit 10 can be part of an FM or AM radio receiver or can be part of an FM or AM radio transmitter. For sake of clarity, it will be assumed that frequency control circuit 10 is part of an FM tuner. Microprocessor 12 is a general purpose digital microprocessor such as the SC/MP microprocessor which is manufactured by the National Semiconductor Corporation of 2900 Semiconductor Drive, Santa Clara, California. The circuit details of this particular microprocessor are described in the *SC/MP Microprocessor Technical Description* which was published by the National Semiconductor Corporation in January, 1976, the entire disclosure of which is hereby incorporated herein by reference. The programming details of this particular microprocessor are provided in the *SC/MP Programming and Assembler Manual* which was published by the National Semiconductor Corporation in October 1975, the entire disclosure of which is hereby incorporated herein by reference. The particular circuit details and programs for microprocessor 12 will not be described herein since the circuitry and programming thereof will be evident to those skilled in the art from the above noted manufacturer's manuals and the description herein of the functions performed by microprocessor 12 in this embodiment. The word "microprocessor" is hereby defined to mean any general purpose digital processor which is formed in accordance with microelectronic circuit techniques on one or more semiconductor chips.

This particular embodiment of the invention has the following major functional capabilities. (1) storing four predetermined frequencies in random-access memory 18 and tuning the tuner to any selected one of the stored frequencies at the touch of a switch; (2) causing the local oscillator to scan up or down in frequency and tune to the nearest adjacent FM station that can be detected by the tuner; (3) causing the local oscillator to tune to only stereo stations in function (2) scanning; (4) causing the tuning circuit to reverse the direction of scanning in function (2) when it reaches the upper or lower limit of the FM band; (5) causing the local oscillator frequency in function (4) to return to its starting frequency before beginning to scan in the opposite direction; (6) causing the scanning operation to cease automatically after both limits of the FM band have been reached once; (7) manual tuning either upwardly or downwardly in frequency from a given starting frequency; (8) performing self-testing routines; and (9) programming in or storing the call letters of a large number, possibly all, of the receivable stations by simply tuning to a station, following a simple procedure to select and display its call letters and to store them in correspondence with the station frequency and effecting display of the proper call letters whenever the station is retuned.

Figure 2A:
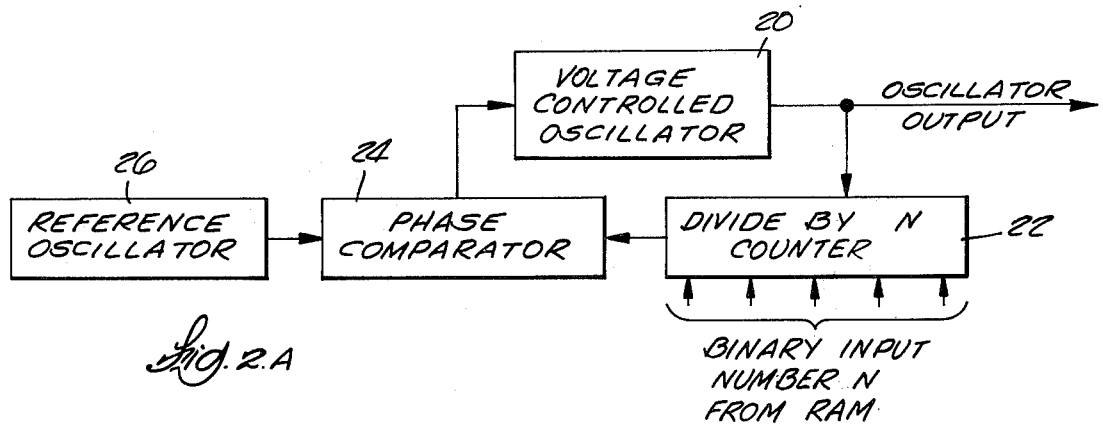
FIG. 2A is a detail block diagram of the frequency control circuit shown in FIG. 1.
Figure 2B:
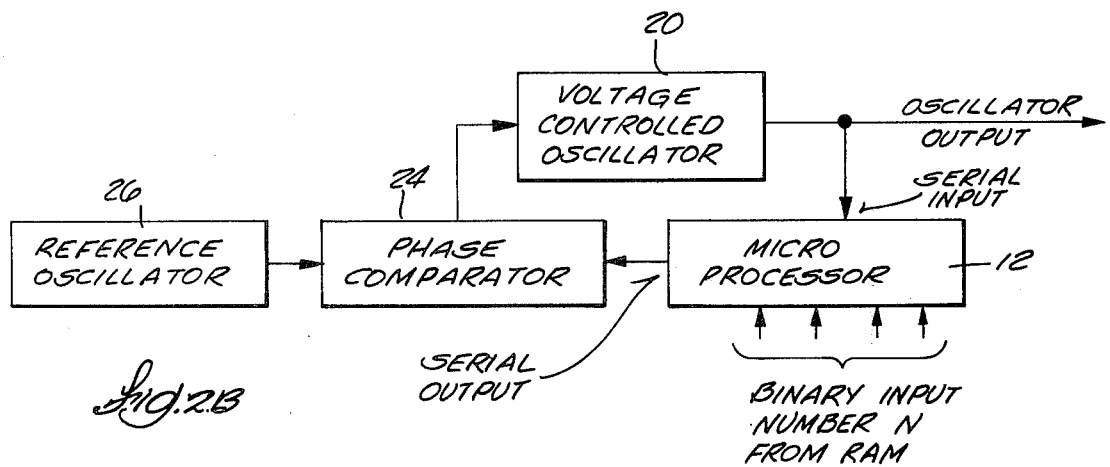
FIG. 2B is a detail block diagram of a modification of the frequency control circuit shown in FIG. 2A.

FIGS. 2A and 2B show alternate circuit configurations for digital frequency control circuit 10. In the circuit shown in FIG. 2A, the output of a voltage controlled local oscillator 20 is applied to the input of a variable divide-by-N counter 22 whose output is applied to one input of a phase comparator 24. The other input of phase comparator 24 is coupled to the output of a reference oscillator 26 which is preferably crystal controlled for accuracy and stability. The output of phase comparator 24 is a d.c. voltage whose magnitude and polarity is proportional to the frequency difference between the output of divide-by-N counter 22 and reference oscillator 26. When the number N is changed at the binary number input to divide-by-N counter 22, the output of phase comparator 24 changes and causes the frequency of voltage controlled local oscillator 20 to change until a new equilibrium condition is attained between divide-by-N counter 22 and reference oscillator 26. The frequency of reference oscillator 20 and the various binary numbers N that are applied to the binary input of divide-by-N counter 22 are selected to produce equilibrium frequencies for local oscillator 20 which accurately correspond to the frequencies of FM stations as is well known to those skilled in the art. Accordingly, voltage controlled local oscillator 20 can be accurately tuned to any desired FM station by applying the appropriate binary number to divide-by-N counter 22. The binary numbers corresponding to all of the frequencies in the FM band are stored in random-access memory 18 and are applied to divide-by-N counter 22 by microprocessor 12 in response to signals from manual control circuit 14 as described hereinafter.

Microprocessor 12 can be used to perform the divide-by-N counter function in digital frequency control circuit 10 by connecting the serial input of microprocessor 12 to the output of voltage controlled local oscillator 20 and connecting the serial output of microprocessor 12 to one input of phase comparator 24 as shown in FIG. 2B. This is an alternate circuit which can be utilized in place of the circuit shown in FIG. 2A.

As shown in FIG. 1, manual control circuit 14 in this particular embodiment has 9 external manual switches 28 which are all capacitive touch switches. The switches are labeled STEREO ONLY, A, B, C, D, STORE, ALPHA, SCAN LEFT, AND SCAN RIGHT. Every time one of the switches 28 is touched, a signal is sent from manual control circuit 14 to microprocessor 12 which responds by interrogating manual control circuit 14 to see which switch or switches have been touched to determine what function is to be performed. To store the frequency of a station, the circuit is first tuned to the desired station by the MANUAL TUNING circuit 30 or by the SCAN LEFT or SCAN RIGHT circuit as described hereinafter. Then the STORE switch is touched followed by a touching of one of the switches A, B, C, or D. This is a signal to store in random-access memory 18 the frequency of the station which the tuner circuit is then tuned to. Upon actuation of the STORE switch and one of the A, B, C, or D switches, storage of this frequency in random-access memory 18 is accomplished by signals from microprocessor 12. Up to four separate frequencies can be stored each corresponding to one of the switches A, B, C, or D. It will be obvious to those skilled in the art that more frequency storage locations could be provided if desired.

Storage of a frequency in the A, B, C or D storage locations in random-access memory 18 also causes the erasure of a frequency previously stored therein.

After a given frequency has been stored in locations A, B, C or D in random-access memory 18, that station can be tuned in at any time by touching the corresponding A, B, C or D switch 28 without touching the STORE switch. Under these switch conditions, signals from microprocessor 12 cause a binary number N corresponding to the stored frequency to be applied to divide-by-N counter 22 of digital frequency control circuit 10 to tune the tuner circuit to the stored circuit. The signals from microprocessor 12 also actuate the corresponding display indicia.

The SCAN LEFT and SCAN RIGHT switches 28 cause the frequency of voltage controlled local oscillator 20 to be moved in digital steps either upwardly in frequency (SCAN RIGHT) or downwardly in frequency (SCAN LEFT) until the next station is tuned in as evidenced by the output of a conventional station detector circuit (not shown). Every time the frequency is changed, the display indicia are changed to correspond to the new frequency. The scan left or scan right operation terminates as soon as the next station is tuned in. If the corresponding limit of the FM band is reached without encountering a station, microprocessor 12 is programmed to return the local oscillator 20 frequency to its starting frequency and then to start scanning in the opposite direction. If no station is detected before the opposite limit of the FM band is reached, microprocessor 12 is programmed to return the local oscillator 20 to the starting frequency and then to terminate the scanning operation.

In the scanning operation, if the STEREO ONLY switch is also touched in addition to the SCAN LEFT or SCAN RIGHT switch, the scanning operation will not terminate for the next station unless it is a stereo station as determined by a conventional stereo detector circuit (not shown).

The details for manual tuning circuit 30 are shown in FIGS. 3A and 3B. The manual tuning curcuit includes an opaque disc 32 which contains two concentric rings of openings 34 and 36 which are circumferentially spaced apart to form alternating opaque and transparent areas. Openings 36 are smaller in their angular dimension than openings 34 and are positioned to overlap one radial side edge of openings 34 as shown in FIG. 3B. Means for detecting that the disc is being rotated and the direction of rotation include two light emitting diodes 38 and 40 (FIG. 3A) and two light sensitive transistors 42 and 44 are mounted on opposite sides of disc 32; diode 38 and transistor 42 being aligned on opposite sides of openings 34, diode 40 and transistor 44 being aligned on opposite sides of openings 36, and disc 32 being mounted for rotation about axis 46 by means of a conventional knob (not shown). As disc 32 is rotated, it causes a pair of square waves to be developed in the output of transistors 42 and 44 due to the alternate transmission and blockage of light from diodes 38 and 40, which are connected in series-parallel between a positive voltage source and ground through resistor 48 and which consequently glow continuously. The emitter-collector circuits of transistors 42 and 44 are connected in parallel between a positive voltage source and ground by means of load resistors 50 and 52 respectively. The output of transistor 42 is applied through an amplifier 54 to the clock input of two D type flip-flops 56 and 58. Flip-flops 56 and 58 trigger on the falling edge of the square wave output from transistor 42 generated by the rotating of disc 32.

The output of transistor 44 is applied through an amplifier 60 to the D input of flip-flop 58. When disc 32 is rotated clockwise, flip-flops 56 and 58 are simultaneously triggered on the falling edge of the square wave output from transistor 42, which occurs each time one of the right hand edges 62 of openings 34 in FIG. 3B moves between light emitting diode 38 and transistor 42. This produces a binary 1 on the Q output of flip-flop 56 due to the fact that the D input is permanently coupled to a positive voltage source which represents a binary 1. The binary 1 on the Q output of flip-flop 56 signifies that disc 32 has been manually rotated. The Q output of flip-flop 56 is coupled to microprocessor 12 to cause the frequency of digital frequency control circuit 10 to change by one increment every time flip-flop 56 is set to 1 by rotation of disc 32. Whether the frequency is increased or decreased is determined by the $\overline{Q}$ output by flip-flop 58. In one direction of rotation of disc 32, flip-flops 56 and 58 trigger on radial edge 62 of openings 34 which coincides with a 1 output from transistor 44 due to the overlap of edges 62 and openings 36. In the other direction of rotation of disc 32, flip-flops 56 and 58 trigger on the opposite radial edge 64 of openings 34 which coincides with a 0 output from transistor 44 due to the fact that radial edges 64 of openings 34 do not overlap openings 36. Thus when disc 32 is rotated in one direction, a binary 1 appears on the $\overline{Q}$ output of flip-flop 58, and when it is rotated in the other direction, a binary 0 appears on the $\overline{Q}$ output of flip-flop 58. The significance of turning direction, i.e. either a raise in frequency or a drop in frequency, is marked on the front panel adjacent to the knob which rotates disc 32. The $\overline{Q}$ output of flip-flop 58 is coupled to microprocessor 12 to indicate whether the frequency is to be raised or lowered. After each increment of frequency change, flip-flop 56 is reset by a signal from microprocessor 12 which is applied to the R input of flip-flop 56. If disc 32 is rotated further, the frequency is increased or decreased by another increment, and so forth.

Referring to FIG. 1, the above-described control circuit can also include a call letter display circuit 66, frequency display circuit 68, and a novel frequency pointer circuit 70 which is disclosed in FIGS. 4A and 4B. Frequency pointer circuit 70 includes a plurality of light emitting diodes 72 which are physically arranged in a line above indicia forming a linear frequency scale 74 as shown in FIG. 4B, each diode being positioned above a corresponding frequency number on frequency scale 74. The anodes of diodes 72 are coupled in parallel to a positive voltage source through a common current limiting resistor 76. The cathodes of diodes 72 are attached to a decoding matrix 78 which receives a binary word representing the station frequency number from microprocessor 12 and grounds the corresponding anode of diodes 72 to indicate on the frequency scale 74 the frequency that the circuit is tuned to. The SCAN LEFT and SCAN RIGHT controls on manual control circuit 14 relate to scale 74 in which the lowest FM station frequency (in megahertz) is on the left and the highest FM station frequency is on the right. SCAN LEFT thus means to decrease the frequency while SCAN RIGHT means to increase the frequency.

The above-described circuit can also include conventional remote control switches 80 (FIG. 1) coupled to manual control circuit 14 and also preferably includes light under each of the switches A, B, C, and D to indicate when the tuner is tuned to the frequencies stored under A, B, C, or D. In the latter case, a binary number comparator 81 (FIG. 5) is preferably coupled between microprocessor 12 and random-access memory 18 to check each time the frequency of digital frequency control circuit 10 is changed to ascertain when the tuner is tuned to one of the frequencies stored under A, B, C, or D. When the latter condition occurs, a signal is sent to lights 82 to light the corresponding light under switch A, B, C, or D and to keep it lit until the next frequency change.

The above described circuit functions constitute the normal mode of operation for the radio control circuit of this invention. By suitably programming read-only memory 16, or by replacing it with a different read-only memory which has been suitably programmed, a self-testing or service mode of operation can be obtained.

Now to be discussed is an example of how the station call letters may be stored for recall and display in correspondence with the station that is tuned. The new system permits the owner to program or store the call letters as required to account for the fact that different parts of the country have different stations.

A requirement for storing the call letters of the respective stations is to tune to the station by any of the means mentioned above such as by operating manual tuning wheel 32. The call letters of the station, of course, must be known.

By way of illustration and not limitation, the first step in this example is to press a first switch called the ALPHA touch switch among the group of touch switches 28 associated with manual control circuit 14. This interrupts the computer so it jumps from its normal tuning mode to its call letter store routine.

The next step is to cause the first character of the call letter to be displayed with the call letter display circuit 66. In this embodiment, four 5×7 dot matrix character display units are used as will be discussed more extensively later. As will also be discussed later, the computer is used to control a character generator which responds to the ASCII code and which is operated in a unique manner. In this example, the first character is caused to be displayed by turning tuning wheel 36. This causes the available characters to be displayed in sequence until the desired letter comes up.

The next step is to touch a second switch called the STORE switch in the group of switches 28. This signals the computer to store the character or letter that is shown by the first display unit. The computer then causes the letter A to be displayed in the next display unit.

The next step is to select the next character by turning tuning wheel 32 until the character appears in the next display unit. Then the STORE switch is touched again and this character is stored in memory by operation of the computer.

The sequence of displaying letter characters and storing by using the STORE switch is repeated until all letters making up the call letters, usually four letters, are displayed and stored after which the computer returns to its normal routine related to tuning as was described earlier herein.

The number of station call letters that can be stored is only limited by the amount of memory available. The call letters of all stations could be stored if desired but about 48 is a reasonable number to allow for since usually not even that many stations can be received by a receiver in a single location.

As a result of the station call letters being encoded and stored, in correspondence with the frequencies of the stations, each time a station is tuned the computer will respond by indirectly controlling the character generator to display the call letters of the station.

The call letters are stored in a table memory. In accordance with the invention, the computer is programmed to search the memory when the call letters are stored to determine whether the particular station call letters have been stored previously. If so, the particular letters are put in the ALPHA memory. If not, the computer, by virtue of its program, does not enable the ALPHA display. The computer is also programmed to cause FULL to be displayed if the whole table memory is full.

Although the mode just described is considered a preferred one for practicing the novel concept of displaying station call letters automatically, other modes are also contemplated and within the purview of the invention. For example, the computer program stored in the ROMs may be structured so that when the ALPHA switch is touched it will cause all of the ASCII characters to be displayed in sequence, that is, incrementally and slowly through the whole list. Then when the desired letter appears on the first display unit a separate switch or the STORE switch, not shown, may be touched to effect storage. This can be repeated until all letters in a station call letter group are stored. Using the tuning wheel to set the characters, as described heretofore is faster, however, since the desired letter or character can be approached quickly by giving a spin to the tuning wheel.

Another feature is programming the computer for editing so that if a wrong letter is accidentally chosen and stored, another touch switch, not shown, may be touched to cause erasure of the previously stored character and allow a new letter to be chosen, displayed and stored by touching the ALPHA switch.

Another editing function for which the computer is programmed is that which enables deleting station call letters which have been previously stored and substituting new ones. This function might be employed if the table memory is full in which case a low priority station might be deleted. Deletion of station call letters is accomplished, in accordance with the invention, by tuning to the frequency of the station whose call letters are to be deleted so its call letters are displayed. Next, the ALPHA switch is touched followed by touching the register A switch in the group of switches 28 associated with the manual control circuit 14. The computer is programmed so it will cause removal of the stored call letters being displayed and an opening will be made in the table.

Figure 6:
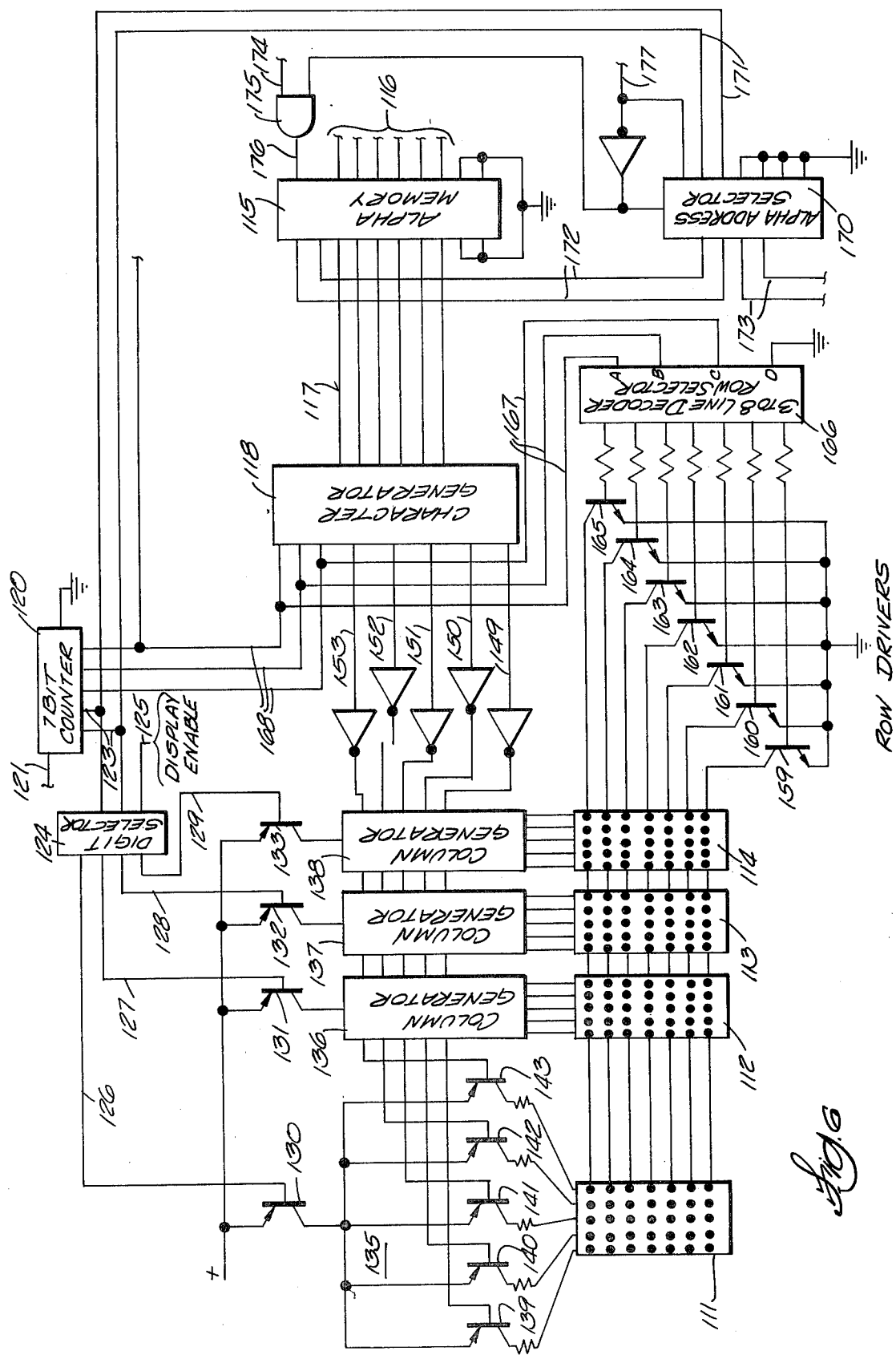
FIG. 6 is a schematic diagram of the circuitry for selecting and displaying characters such as the call letters of a radio station.

The circuitry and devices involved in displaying characters, such as the call letters of the currently tuned station, will now be described in reference to FIG. 6. In this embodiment four dot matrix display units 111, 112, 113 and 114 are used. The dots in the five columns and seven rows are usually light emitting diodes (LEDs) as is well-known. For convenience, the units 111-114 will also be called digits.

The display units 111-114 are driven in a unique way which eliminates the multiplicity of buffers and latches which are present in the commonly used schemes for driving displays. In the present case the display units are multiplexed row-by-row or column-by-column within each unit and the four units are also multiplexed. The illustrated circuit is connected for row-by-row multiplexing. In other words, the rows in the first unit 111, for instance, are written sequentially starting from the top. When all rows in the first unit are written such that the displayed character is complete, the next unit 112 is written row-by-row until the character is complete and the process is repeated for the next two units 113 and 114 or for as many units as might be used. The multiplexing within display units and between them is so fast that the eyes perceive four persisting characters on display.

The letters of the alphabet for forming station call letters are assumed to be stored as binary encoded words in random-access memory 18 in a look-up table format. When a station is tuned the computer causes delivery of the digital data for the call letter characters to be inputted to a temporary or scratch pad type memory, herein called ALPHA memory 115, from the look-up table. The data lines are marked 116. Memory 115 is a 4-word, 8-bit type in this example and may be a type CD 4036. The output data from memory 115 is ASCII coded for the respective characters. This data is inputted to read-only-memory type character generator 118 which is a Signetics 2513 in a commercial embodiment.

The timing and control unit for the display system is a pulse counter 120 which can be a 7-bit counter in this case. The input lines for clock pulses is marked 121 but the clock pulse generator is not shown. The clock rate may be 100 kHz typically.

Output lines 123 from counter 120 are called the alpha display address lines and are 2-bit lines which provide 4 states corresponding with the number of digit displays or characters. Lines 123 are inputs to a digit selector 124 which is essentially a decoder. It has an enable input line 125 which receives a signal to enable the selector when the computer dictates that station call letters or some other characters are to be displayed. Digit selector 124 has four output lines 126-129 which are grounded in the same order in correspondence with the state changes on the ALPHA display address lines 123. Sequential grounding of lines 126-129 results in grounding of the bases of digit driver transistors 130-133 and, hence, in pulsing each of said transistors on and off in sequence.

There is a column driver 135, 136, 137 and 138 for the respective digit displays 111, 112, 113 and 114. Drivers 136-138 are shown in block form but they are similar to column driver 135 and are essentially conventional. Typical driver 135 has 5 transistors 139-143, one for each column, in the LED matrix or digit display 111. If digit driver transistor 130 is on, transistors 139–143 can be selectively on and off to energize or deenergize the columns as determined by binary data from character generator 118. The data for specifying the columns in the dot matrix displays is delivered to each of them by way of inverters 154 in column selector data lines 149–153.

A group of transistors 159–165 are the drivers for the respective rows in the diode matrixes or digit displays 111–114. The bases of these transistors are connected to the outputs of a decoder 166, which in this case, is a 3-to-8 line decoder which serves as a row selector. The 3-bit data input to decoder 166 is by way of lines 167. For each character that is to be displayed, row driver transistors 159–165 are selectively turned on or off to either ground or unground the diodes in a row so that the proper diode dots in each column which are energized coincidentally result in a digit being written on a row-by-row basis for whatever digit is energized through its driver transistor 130 to 133 at the time.

The encoded row data on lines 167 from character generator 118 is sequenced synchronously with digit selection in order to enable row-by-row writing in each digit display in the group of 111–114. For this reason, lines 167 are not only connected to the 3 row outputs of generator 118 but also to 3 output lines 168 of counter control unit 120. The counter output assures that the lines 167 will be grounded by character generator 118 in the order of the rows.

ALPHA memory 115, in which the data words for the characters of the station call letters are stored for the particular station which is tuned, must be addressed sequentially to cause the ASCII data to be sent over lines 117 to the character generator in a repeatable sequence. An ALPHA memory 115 address selector 170 is provided for this purpose. Selector 170 has 2-bit, 4-state address input lines 171. These lines have the same binary 00 to binary 11 states appearing on them sequentially as do the two lines 123 to digit selector 124 which are coupled with the control unit or counter 120. Thus, the ASCII code words can be called from ALPHA memory 115 synchronously with the turning on of the digit drivers 130–133. Selector 170 may be a type CD 4019A. It has 2-bit address lines 172 on which the code for reading out the ALPHA memory is routed.

Address selector 170 also has 2-bit, 4-state input lines 173 by way of which the computer addresses the selector and, hence, the ALPHA memory when the computer wants the data for the 4 digits or characters of a station's call letters to be written into the ALPHA memory 115 from the call letter table memory by way of data lines 116. When the computer is ready to write into the ALPHA memory 115 it generates two signals. One is a memory write signal which is applied to input 174 of a gate 175 which has an output 176 to memory 115. The other is an address enable signal which is supplied from the computer over line 177 which runs to ALPHA address selector 170. Upon occurrence of these signals the location in the memory 115 is addressed by whatever address is supplied on lines 173 and output to memory 115 from address selector 170 by way of lines 172 as mentioned above. After the above mentioned two signals occur and after and ALPHA memory is addressed the computer applies a pulse and strobe signal to gate input 174 which causes the character data from the computer on lines 116 to be written into memory 115.

From the foregoing it will be evident that the operating mode is for the character generator to put out the ASCII code data for each character in sequence. When the data for the first call letter character exists, the first digit driver 130 will be turned on and the column's transistors 139–143 will be on or off depending on the code for the character. The row drivers are simultaneously and sequentially turned on or held off depending on the code for the character to produce the coincidences which develop the dot matrix character on a row-by-row basis. As soon as the first character is complete its digit driver 130 turns off and the next one 131 turns on so its associated display 112 can be driven on a row-by-row basis. By this time the character generator is presenting the coded data for the next character for display 112 because of the synchronous drive described above. The process is repeated for all the characters and then there is a return to the first character. Thus, each displayed character is completely written on a row-by-row basis before the next character is written.

A significant feature of the display scheme is that only one character generator needs to be used for the several display units and even more units in excess of the four comprised of 111–114 could be driven if desired without any noticeable flicker. Another significant feature is that the usual latches for holding the data related to each display are not needed as they are in prior art schemes where the first row (or column) in each display unit is written followed by writing the second row in each unit and so on.

Those skilled in the art will recognize that the new dual multiplexing technique can be employed to write the characters on a column-by-column basis as well as using the concepts which are hereinabove described in detail in reference to writing row-by-row.

The interrelation and control of the various functions described above will now be discussed in greater detail. A feature of the system is executing the various functions in response to addressing station base members. For instance, each frequency which corresponds to a receivable station is assigned a station base number and this number is stored in memory. In the United States the assigned station frequencies are between 87.5 MHz and 108.9 MHz in 200 kHz steps. In other countries they may be between 87.6 MHz and 109.0 MHz. Hence, in this embodiment a binary digit number in a sequence corresponding with the station frequencies is permanently stored for both sequences. All functions are initiated by simply causing the computer to access any station base number. The computer then calculates a binary code word to control each functional block such as the frequency pointer circuit 70, the frequency display circuit 68, frequency control circuit 10 and so forth to cause these blocks to perform a function as was described in detail earlier.

The statements in the preceding paragraph will now be elaborated in reference to the FIG. 7 flow chart. When the radio receiver is turned on the computer directs an initialization routine which, among other things, results in the receiver being tuned to the station to which it was tuned when turned off. This is possible because everything in the memories is preserved by applying battery power when line power is interrupted.

By virtue of the station base number for the tuned station being accessed, the computer calculates the binary numbers which must be supplied to the various functional block logic circuits to bring about all functions which are related to the tuned station. For example, as shown in FIG. 7, one thing that happens is the frequency pointer circuit 70 is loaded with a computer calculated number which would be properly encoded in the pointer circuit logic and fed to the inputs of decoding matrix 78 in FIG. 4A. The decoder would then energize the light emitting diode 72 which corresponds to the frequency relating to the same station base one the scale shown in FIG. 4B.

Another event would be to load the divide-by-N counter logic with a computer calculated binary number which is processed and the encoded signal is supplied to the input of the counter 22 to bring about tuning of the receiver, as described earlier, to the frequency which relates to the selected station base number.

The frequency display 68 circuit logic is also loaded with a computer calculated number, which depends on the selected station base number, to cause the station frequency to be displayed. Similarly, the ALPHA display logic is loaded with the base number corresponding data so the station call letters, if any are stored will be displayed. A memory match is also made. When all of the circuits are loaded with computer calculated digital numbers that command their function, the update subroutine is complete, a halt signal occurs and the computer is restored to execute its regular tuning routines such as manual tuning and autoscan.

Consider now the left column of blocks in FIG. 7 and assume that the system has been initialized as just described. Now, for example, if a different station is tuned using the devices of FIGS. 3A and 3B, the computer would access a new corresponding station base number and all of the functions in the right column would be updated. This is indicated by the manual tune block in the left column leading to the functions column at the right.

When any of the modes in the left column of blocks is executed the functions at the right are updated. For instance, when the four stations A, B, C and D on special recall are being stored the computer relates their respective frequencies to their station base numbers and all of the data relating to them such as their call letters, frequency numbers is subject to recall. When there is recall all of the functions in the right column are updated immediately. The same is true of ALPHA store. The speed of updating is evidenced during manual tuning where the operator can observe the frequency scale pointer diodes going on and off as the frequency is being changed until the desired station is reached.

We claim:

1. A radio receiver comprising:
   a digital microprocessor,
   program memory means coupled to said microprocessor, said memory means being for storing instructions for said microprocessor,
   random-access memory means coupled to said microprocessor for storing digital data produced with and used by said microprocessor,
   one of said memory means storing numbers in binary digital form corresponding respectively with station frequencies to which said receiver is tunable,
   tuning means responsive to digital signals by tuning said radio to frequencies of respective stations,
   means for controlling said microprocessor to select one of said stored numbers and produce a corresponding digital tuning signal for causing a response by said tuning means,
   said means for controlling said microprocessor including a manually rotatable opaque disc having spaced apart openings therein, means for continuously generating light adjacent said openings on one side of said disc, light responsive means mounted adjacent said openings on the other side of said disc,
   circuit means coupled to said light responsive means for detecting a transition from a lighted to an unlighted condition of said light responsive means to indicate that said disc is being moved and to indicate its direction of motion, and
   means coupling said circuit means to said microprocessor for controlling it to vary the frequency to which said receiver is tuned when said disc is rotated.

2. The receiver as in claim 1 including:
   frequency display circuit means and frequency number display means, said circuit means being responsive to the input of a digital signal by controlling said display means to display the frequency numbers of a station to which said receiver is tuned, data corresponding with the frequencies of the respective stations being stored in said memory means, and
   said microprocessor using said data to produce a digital signal in response to selection of one of said numbers which correspond with respective frequencies, said last named signal being coupled to said frequency display circuit means for causing said display of said frequency numbers.

3. The radio control circuit of claim 1 wherein said tuning means comprises a digital frequency control circuit including a voltage controlled oscillator having a control signal input and an oscillator output, a phase comparator having two inputs and an output, a reference oscillator coupled to one input of said phase comparator, the output of said phase comparator being coupled to the control voltage input of said voltage controlled oscillator, means coupling said tuning signal from said microprocessor between the output of said voltage controlled oscillator and the other input of said phase comparator, and means within said microprocessor for dividing the frequency of said local oscillator by a predetermined binary number N.

4. In a radio receiver as in claim 1, frequency display means comprising a panel and indicia signifying said frequency range marked on said panel, a plurality of visible indicators each mounted on said panel adjacent a corresponding frequency marking of said indicia, said microprocessor accessing a said stored digital number constituting a control signal corresponding with the frequency to which said receiver is tuned, and means responsive to said control signal by energizing the indicator which is adjacent the frequency to which said radio circuit is tuned at any given time.

5. The frequency display circuit of claim 4 wherein said indicia are arranged in a straight line and wherein said indicators are arranged in a straight line adjacent to said indicia.

6. The radio receiver as in claim 1 wherein said light responsive means comprises two light responsive transistors each positioned adjacent to said openings, a pair of D-type flip-flops, circuit means for energizing both of said transistors and for coupling the output of one transistor to the clock input of both of said flip-flops, means coupling the output of the other transistor to the D input of one flip-flop, means continuously coupling a signal representing a binary 1 to the D input of the other flip-flop, and means coupling one output of both flip-flops to said microprocessor.

7. The radio receiver as in claim 6 and further comprising means for resetting said other flip-flop after it has been set by a clock signal from said transistor.

8. The radio receiver as in claim 1 wherein there are two groups of radially extending and circumferentially spaced openings in said opaque disc, each opening of the group having the lesser radii being angularly offset with respect to the radial edge of a corresponding opening of the group having the greater radii.

9. The radio receiver as in claim 6 in which each light responsive transistor is positioned adjacent a corresponding one of said groups of openings.

10. The radio receiver as in claim 1 and further comprising means for storing in said random-access memory data corresponding with a predetermined group of frequencies and, means for controlling said microprocessor to recall the data corresponding to one of said frequencies and to use said data for tuning said receiver to said recalled frequency.

11. The radio receiver as in claim 10 and further comprising binary number comparator means coupled between said microprocessor and said random-access memory means to determine when said radio receiver is tuned to one of said predetermined frequencies in said group, a plurality of indicator lights each of which is in a position corresponding with the frequency that is tuned and means for lighting one of said plurality of indicator lights to indicate the frequency to which the receiver is tuned.

12. A radio receiver comprising:
a digital microprocessor,
program memory means coupled to said microprocessor, said memory means being for storing instructions for said microprocessor,
random-access memory means coupled to said microprocessor for storing digital data produced with and used by said microprocessor,
one of said memory means storing numbers in binary digital form corresponding respectively with station frequencies to which said receiver is tunable,
tuning means responsive to digital signals by tuning said radio to frequencies of respective stations,
means for controlling said microprocessor means to select one of said numbers and produce a corresponding digital tuning signal for causing a response by said tuning means, and
call letter display circuit means and call letter display means, said display circuit means being responsive to the input of a digital signal by controlling said display means to display the call letters of a station to which said receiver is tuned, data corresponding with the call letters of stations, respectively, being stored in said random-access memory means, and said microprocessor using said data to produce a digital signal in response to selection of one of said numbers, said last named signal being coupled to said display circuit means for causing said display of said call letters.

13. In a radio, microprocessor means including random-access memory means and program storage memory means, one of said memory means storing numbers in binary digital form corresponding respectively with radio station frequencies to which said radio is tunable, tuning means responsive to said microprocessor selecting stored numbers by tuning said radio to the corresponding frequency of a radio station, and means for controlling said microprocessor to cause a response by said tuning means comprising an opaque disc having spaced apart openings therein, means for continuously generating light adjacent to said openings on one side of said disc, light responsive means mounted adjacent said openings on the other side of said disc, detecting means coupled to said light responsive means for detecting a transition from a lighted to an unlighted condition of said light responsive means for producing signals indicative of said disc being moved and indicative of its direction of motion, said microprocessor responding to said signals by selecting stored numbers and causing said tuning means to vary the frequency to which said radio is tuned in correspondence with rotation of said disc, said light responsive means comprising two light responsive transistors each positioned adjacent to said openings, a pair of D-type flip-flops, circuit means for energizing both of said transistors and for coupling the output of one transistor to the clock input of both of said flip-flops, means coupling the output of the other transistor to the D input of one flip-flop, means continuously coupling a signal representing a binary 1 to the D input of the other flip-flop, and means coupling one output of both flip-flops to said means that respond to said detecting means.

14. The radio as in claim 13 and further comprising means for resetting said other flip-flop after it has been set by a clock signal from said transistor.

15. The radio control circuit of claim 14 wherein there are two groups of radially extending and circumferentially spaced openings in said opaque disc, each opening of the group having the lesser radii being angularly offset with respect to the radial edge of a corresponding opening of the group having the greater radii.

16. The radio control circuit of claim 15 in which each light responsive transistor is positioned adjacent to a corresponding one of said rings of openings.

17. In a radio, computer means including program memory means for storing a program to control said computer means; random-access memory means for storing binary data corresponding with radio station frequencies and for storing binary data corresponding with characters including the letters of the alphabet; tuning means controlled by said computer means to tune said radio to receive frequencies of radio stations in response to said computer means accessing stored binary data corresponding with respective radio station frequencies; and, means for enabling exhibiting the call letters of a station coincidental with said station being tuned, said last named means comprising:
means selectively operable when said receiver is tuned to a radio station for controlling said computer means to select from said random-access memory means coded data representative of characters of which station call letters are comprised,
a plurality of electroresponsive display devices for displaying selected characters,
character generator means having input and output means and being operative to produce output signals for energizing said display devices, respectively, in response to input of coded data to said input means from said random-access memory means, and
means for controlling said computer means to store data in said random-access memory corresponding to said displayed call letters when they are first displayed, said data being stored for recall by said computer means concurrently with said radio being tuned to the same frequency to which the call letters relate.

18. A radio receiver comprising:

a digital microprocessor, program memory means coupled to said microprocessor, said memory means being for storing instructions for said microprocessor, random-access memory means for storing data and for enabling access to data by said microprocessor, tuning means responsive to selected digital signals provided by said microprocessor by tuning said radio to the frequency of respective stations, said random-access memory means storing digital data corresponding with the letters of the alphabet, manually operable means for controlling said microprocessor to select data corresponding with letters for composing the call letters of a station which is tunable, means for displaying call letters, temporary memory means for storing data corresponding with said selected data, character generator means responsive to data in said temporary storage means by activating said display means to display letters corresponding with said data in said temporary memory means, means operable to store data in said random-access memory means corresponding with the data for the call letters which are displayed when said radio is tuned to the frequency of a station, and said microprocessor causing said stored data representing the call letters of the respective stations to be recalled and supplied to said temporary memory means whenever said radio is tuned to the station frequency to which the call letters relate.

19. The radio as in claim 18 including:

manually operable group of switch means corresponding in number with the maximum number of letters that comprise station call letters and an additional store switch means, means responsive to operation of said switches in said group successively by activating said display means successively to thereby allow visualization of said call letters as they are produced and displayed, and means responsive to operation of said store switch after each of said switches in said group is operated by effecting storage of the data which is subject to recall when the same station is retuned.

* * * * *